United States Patent [19]
Ginley et al.

[11] Patent Number: 5,262,395
[45] Date of Patent: Nov. 16, 1993

[54] SUPERCONDUCTING ACTIVE IMPEDANCE CONVERTER

[75] Inventors: David S. Ginley, Albuquerque; Vincent M. Hietala, Placitas; Jon S. Martens, Albuquerque, all of N. Mex.

[73] Assignee: The United States of America as represented by the United States Department of Energy, Washington, D.C.

[21] Appl. No.: 850,475

[22] Filed: Mar. 12, 1992

[51] Int. Cl.⁵ .............................................. H03F 3/00
[52] U.S. Cl. ................................. 505/855; 307/306; 330/61 R; 330/252
[58] Field of Search ............... 330/60, 61 R, 61 A, 330/62, 63, 252; 307/306, 245; 505/855

[56] References Cited
U.S. PATENT DOCUMENTS
3,356,960 12/1967 Edwards et al. .................. 330/61 R Primary Examiner—James B. Mullins
Attorney, Agent, or Firm—Karla Ojanen; James H. Chafin; William R. Moser

[57] ABSTRACT

A transimpedance amplifier for use with high temperature superconducting, other superconducting, and conventional semiconductor allows for appropriate signal amplification and impedance matching to processing electronics. The amplifier incorporates the superconducting flux flow transistor into a differential amplifier configuration which allows for operation over a wide temperature range, and is characterized by high gain, relatively low noise, and response times less than 200 picoseconds over at least a 10-80 K. temperature range. The invention is particularly useful when a signal derived from either far-IR focal plane detectors or from Josephson junctions is to be processed by higher signal/higher impedance electronics, such as conventional semiconductor technology.

13 Claims, 6 Drawing Sheets

SUPERCONDUCTING ACTIVE IMPEDANCE CONVERTER

The United States Government has rights in this invention pursuant to Contract No. DE-AC04-76DP00789 between the Department of Energy and American Telephone & Telegraph Company.

BACKGROUND OF THE INVENTION

This invention relates generally to the field of superconducting electronics, and more particularly, to a transimpedance amplifier for a weak current source, which may originate from superconducting electronics, to interconnect with conventional semiconductor or other high impedance electronics.

Superconducting electronics yield important advantages such as the high speed, minimal noise, and low power not available with conventional semiconductor electronics. Semiconductor electronics, on the other hand, have the unparalleled advantages of memory capabilities and a well-developed technology base. A hybrid technology to exploit the advantages of both superconductors and semiconductors is developing. One of the most challenging aspects facing developers of this hybrid technology is the development of an interface circuit to convert signals from superconducting circuits to semiconductor technologies, such as CMOS. See Ghoshal et al., *Spice Models and Applications of Superconducting FETS and Higher-Voltage Josephson Gates*, 1991 IEDM Conference.

Such transimpedance amplifiers using conventional semiconductor technology requires exceedingly complicated circuits having a number of transistors and many passive components which perform within a limited temperature range and which are characterized by high noise. Typical pre-amplifiers used may consist of several MOSFET stages as discussed in Paik et al., "A Staring Monolithic FPA with High Speed Readout and Frame Averaging," Northrup Technical Report, p. 11 (December 1987). MOS devices, however, generally cannot operate at low superconducting temperatures, and performance is not uniform across the temperature ranges of interest. This limitation is in fact true for all semiconductor-based systems because of carrier freeze-out and other thermal effects. To data, there is no superconducting device which will transform a weak current from a superconducting source to a higher voltage for use in semiconductor circuits, and which allow for signal conversion from a low impedance circuit to a high impedance system.

It is thus an object of the invention to provide impedance conversion from a low impedance circuit, which may or may not include superconducting electronics, to a higher impedance circuit, typically conventional semiconductor electronics. This object is achieved through the use of the superconducting flux flow transistor (SFFT), and given that the impedance characteristics of the differential structure of the transimpedance amplifier of the invention is not significantly different from the impedance characteristics of the SFFT itself. An additional advantage of this particular feature of the invention results in low power dissipation.

It is another object of the invention to provide for amplification of a weak current to sufficient voltage suitable for semiconductor applications. This differential amplifier configuration of SFFTs increases the output voltage available. An advantage of this increased output voltage is increased compatibility with multiple forms of conventional electronics.

It is another object of the invention to provide for the reduction of noise which is achieved by the differential configuration of SFFTs which allows the circuit to be used in more electromagnetically sensitive environments.

It is another object of the invention to provide for wide bandwidth from GHz down to DC with adequate gain. Bandwidth of the amplifier itself is preserved by the differential configuration of the transimpedance amplifier.

These and other objects are achieved by the invention specified and claimed herein as a transimpedance amplifier which has at least a first and a second SFFT connected in parallel, each having a control line and means to apply a signal to the control lines of each SFFT, but the signal as applied to one SFFT being of opposite polarity than the signal as applied to the other SFFT, and a means to provide a current bias to each SFFT sufficient to drive each SFFT transistors into a flux flow state, wherein the signal applied to the control lines of each SFFT is converted to higher signal and higher impedance levels which is taken across the means to provide a current bias to said transistors. In addition, impedance elements having a resistive component can be connected between each SFFT and the means to provide a current bias to each SFFT wherein the impedance elements increase said output signal and impedance.

A double differential transimpedance amplifier then comprises a first and a second SFFT connected in parallel, each having a current bias applied, and a control line input of low impedance and weak current, wherein the input as applied to the first SFFT is of opposite polarity than that applied to the second SFFT, and an output of the first and second SFFTs taken across the bias wherein the output is an amplified signal of the low impedance, weak current input; and further comprising a third and a fourth SFFT connected in parallel, the third and fourth SFFT also having a current bias applied, and an ancillary impedance connected between the bias and each of the third and fourth SFFT, and having a second input which is the output of the first and second SFFT, wherein the input as applied to the fourth SFFT is of opposite polarity than that applied to the third SFFT, wherein the output of the third and fourth SFFT is an amplified signal of the second input, and the bias is sufficient to drive each SFFT into a flux flow state.

It is envisioned that the input to the transimpedance amplifier can be from any weak current source, and can be high temperature superconductor electronics, superconductor electronics, or conventional semiconductors. The invention is particularly useful when the input is provided by far-IR focal plane detectors or Josephson junctions because of the temperature and frequency range enabled by the invention.

The invention, moreover, comprises a differential amplifier stage wherein the input to the first amplifier stage is derived from the low impedance signal source, and the output of each stage is applied as input to the control lines of the next amplifier stage, with the final output differential amplifier stage having the resistive elements between the bias and the SFFTs for appropriate impedance matching to the processing electronics, usually of conventional semiconductor electronics.

The invention is described with reference to the following figures.

DESCRIPTION OF THE INVENTION

Figures 1, 1A, 1B, 2:
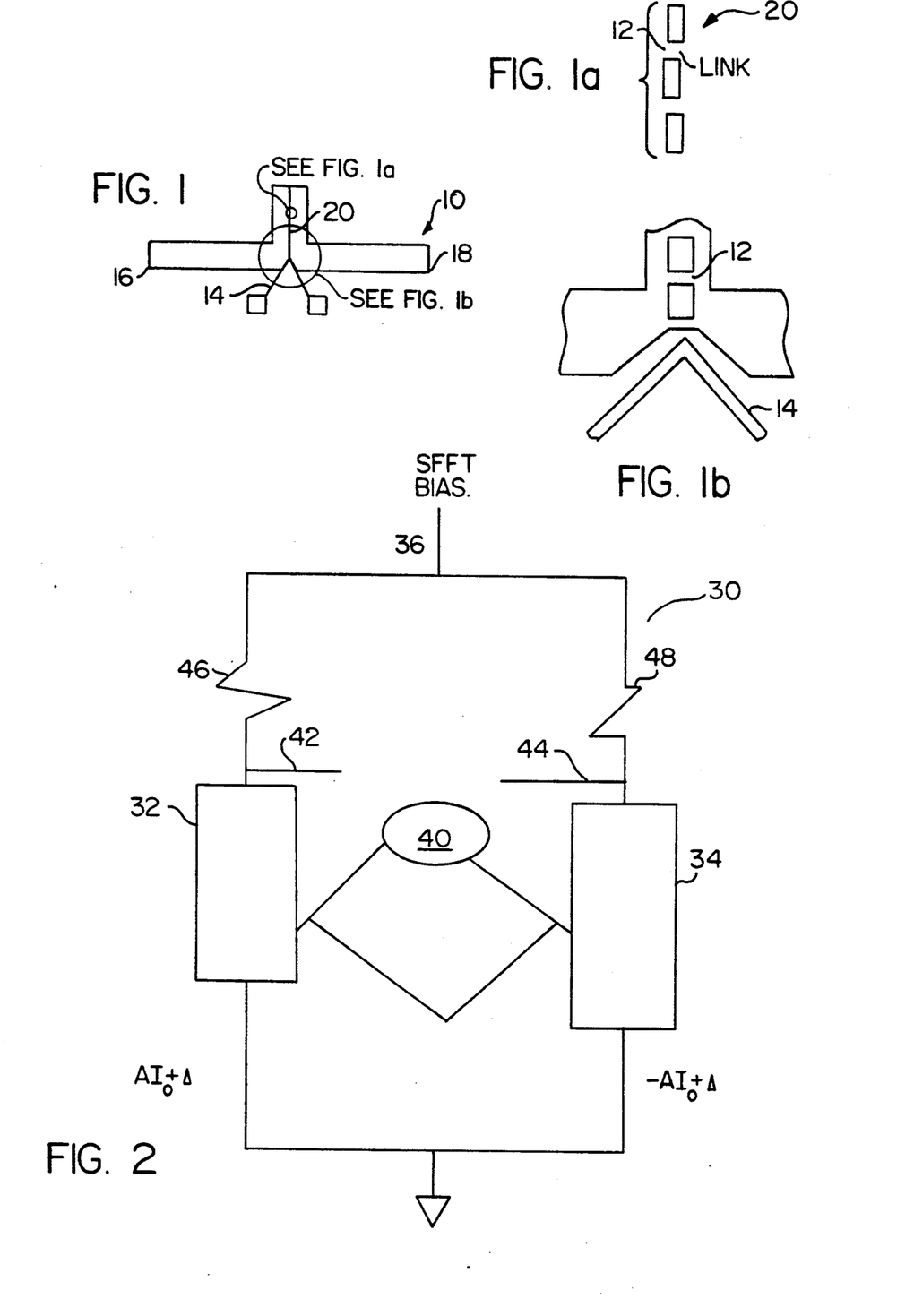
FIG. 1 illustrates a layout of the superconducting flux flow transistor (SFFT) used in the transimpedance amplifier of the invention.
FIG. 2 illustrates a schematic of the invention using one pair of SFFTs arranged as a differential amplifier.

The transimpedance amplifier of the invention utilizes the unique characteristics of the superconducting flux flow transistor (SFFT) more fully described in U.S. Pat. No. 5,019,721, entitled "Active Superconducting Devices Formed of Thin Films," to Martens et al., herein incorporated by reference. FIG. 1 illustrates a sample layout of the SFFT 10. The SFFT 10 is a device which can be made of a single film of most superconductors, and may utilize TlCaBaCuO films to maximize the operating temperature range. The SFFT 10 consists of a parallel array 20 of superconducting links 12, connecting the two output terminals, 16 and 18, biased such that flux quanta or vortices move across the links 12 at reasonably high speed. An adjacent superconducting control line 14 provides a local magnetic field to alter the flux state and hence the terminal voltage. Such a device can be characterized by a low input impedance wherein the control line 14 represents a near superconducting short which can be driven easily by a small current source; a transresistance element of approximately 15-25Ω (not shown in FIG. 1), a finite output resistance of approximately 3-6Ω (also not shown in FIG. 1), low cross talk and primarily inductive parasitics. The SFFT 10, moreover, has high power gain and impedance levels suitable for active impedance conversion because it has low input impedance and an output impedance that matches readily to conventional circuitry. Among the material parameters that affect device performance are pinning and critical fields. Weaker pinning leads to faster and more sensitive devices, and lower critical fields lead to more sensitive SFFTs. A current in the low impedance control line 14 modulates bundles of magnetic flux in the link system 20 to ultimately determine the output voltage.

Devices made from different superconducting materials will have different performance. YBaCuO films made by some processes are highly pinned, but even with processing modifications to make the links thinner which promote lower $H_{cl}$ and easier flux flow, the flux still moves relatively slow. This results in smaller bandwidths and typically lower sensitivities than with devices made from TlCaBaCuO or the more weakly pinned YBaCuO. In TlCaBaCuO there is the added complication of a transition in the flux lattice in the 25-35K range. Below that temperature the lattice nucleates resulting in somewhat slower flux speeds and reduced sensitivity. This behavior also occurs in BiSrCaCuO and may occur in some YBaCuO films.

The configuration used for the transimpedance amplifier 30 is shown in FIG. 2 and is a differential pair of SFFTs 32 and 34. A bias current 36 is applied to the body of each SFFT 32 and 34, sufficient to drive each SFFT 32 and 34 into a flux flow state. The bias current 36 is applied by means of a bias means which is present on all the stages of the SFFTs 32 and 34; the bias means also modifies the magnetic field sensitivity of the SFFTs. The actual current bias 36 may be supplied from a current source. A source 40 applies a weak current, $I_O$, to the control line (as seen in FIG. 1 as 14) of SFFT 32, and a current of opposite polarity, $-I_O$, to the control line of SFFT 34. Thus, the current $A \cdot I_O + \Delta$ flows through the body of SFFT 32, whereas the current $-A \cdot I_O + \Delta$ flows through the body of the other SFFT 34. This weak current source 40 may be an array of Josephson junctions or IR detectors; alternatively, the weak current source 40 may be other superconducting sources, including HTS sources, or the current source may be of conventional semiconductors; so long as there is a weak current source into a low impedance network. The output of the differential amplifier 30 using one pair of SFFTs 32 and 34 is taken between the upper terminals 42 and 44 of the SFFTs 32 and 34, respectively. Resistive elements 46 and 48 may be connected between the bias 36 and the body of each SFFT 32 and 34, respectively, and the use of resistance is preferred because they facilitate extraction of voltage rather than a current output from the transimpedance amplifier 30. The use and values of these resistive elements 46 and 48 are dependent upon the actual application of the transimpedance amplifier 30. The resultant output from this differential pair 30 of SFFT 32 and 34 is essentially $2AI_O$; thus the current has been amplified, and the contribution from noise and bias, $\Delta$, in each control has been cancelled.

Figure 3:
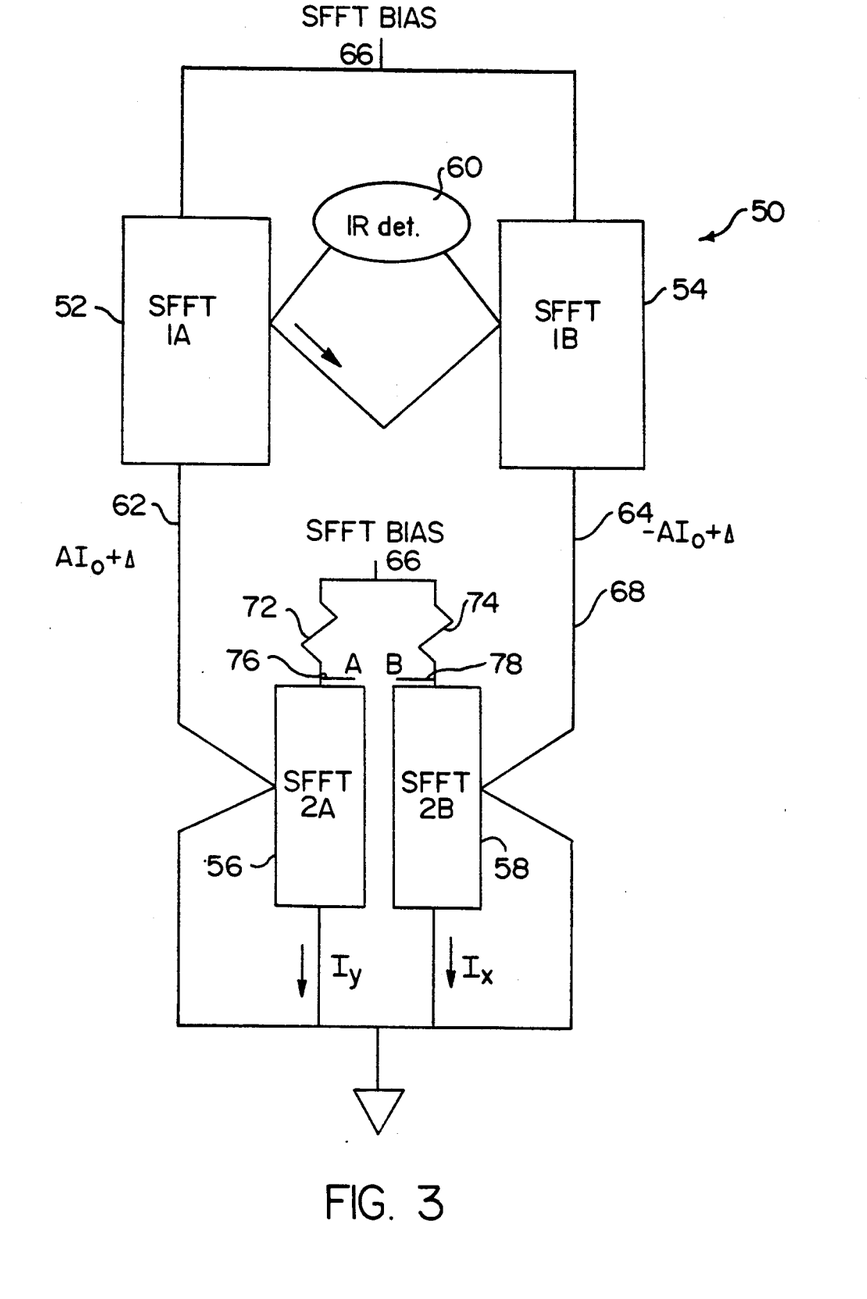
FIG. 3 is another embodiment of the invention which is a doubly differential superconducting transimpedance amplifier, using, for example, an IR detector as a current source for the transimpedance amplifier.

As shown in the schematic of FIG. 3, two differential pairs of SFFTs, 52 and 54, are arranged as one differential amplifier, and 56 and 58 as a second differential amplifier. These two pairs of differential amplifiers are configured into a doubly differential amplifier 50 wherein the output 62 and 64 of the first differential pair 52 and 54 serves as the input to the control line of the second differential pair 56 and 58. A bias current 66 sufficient to drive each SFFT into a flux flow state is applied to each of the four SFFTs 52, 54, 56, and 58. Just as above in the case shown in FIG. 2 of a single pair of SFFTs 32 and 34 arranged in a differential amplifier 30, the resultant output 62 from SFFT 52 shown in FIG. 3 is $A \cdot I_O + \Delta$, whereas the resultant output 64 from SFFT 54 is $-A \cdot I_O + \Delta$; these outputs are applied to the control line of each individual SFFT 56 and 58, respectively of the second differential pair 50. The second differential amplifier pair 50 then amplifies the signals so that the signal through the body of SFFT 56 is $A^2 \cdot I_O + \Delta'$, and the signal through the body of SFFT 58 is $-A^2 \cdot I_O + \Delta'$. The resultant output voltage is taken across the upper terminals 76 and 78 of SFFTs 56 and 58, respectively and is proportional to $2A^2 \cdot I_O$. Impedance elements with resistive components 72 and 74 again may be used to enhance the output signal across terminals 72 and 74 for compatibility. This arrangement results in high gain, high speed, a wide bandwidth from DC to GHz, and good noise immunity.

Figure 9:
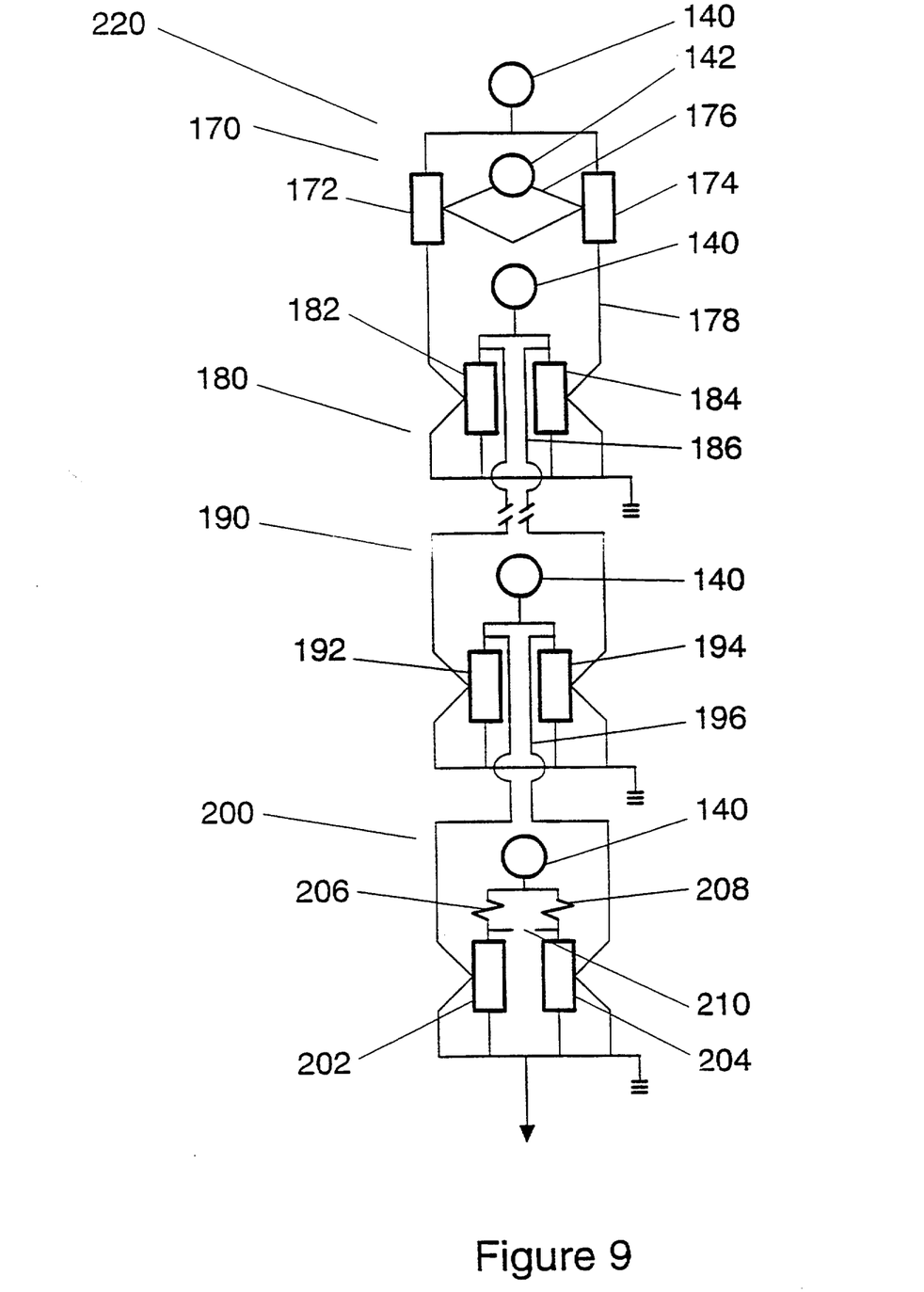
FIG. 9 illustrates a multiple stage transimpedance amplifier.

The transimpedance differential amplifier may be configured into multiple stages of the amplifier described with respect to FIG. 2, wherein the output of one differential stage is applied to the control line of the subsequent differential stage. A multiple stage transimpedance differential amplifier 220 is shown in FIG. 9. Bias means 140 is sufficient to drive each SFFT, 172, 174, 182, 184, 192, 194, 202, and 204, into a flux flow state. A weak current source 142 drives the control lines 176 of SFFTs 172 and 174 with opposite polarity of the first amplifier stage 170. The output 178 of the first amplifier stage is provided as input to the second amplifier stage 180 having SFFTs 182 and 184. The output of the second amplifier stage 186 is then provided as input on the control lines of a subsequent amplifier stage 190 comprising SFFTs 192 and 194. Likewise, the output of that amplifier stage 196 is provided as input into the final amplifier stage 200. Again, each SFFT of any single stage has an input of opposite polarity of the other SFFT of the same stage, thus the input to SFFT 202 is of opposite polarity than the input to SFFT 204. The final output of the device 220 is taken across terminals 210 of the SFFTs 202 and 204 of the final stage 200. Generally, the impedance elements with the resistive components, shown as 46 and 48 in FIG. 2 and shown as 72 and 74 in FIG. 3 and which are illustrated in FIG. 9 as elements 206 and 208, need only be used at the output terminals of the final transimpedance differential amplification stage. Moreover, in general, as the stages of transimpedance differential amplifiers increase, the bandwidth of the device will decrease. Also, the more stages of differential pairs of SFFTs used in the transimpedance differential amplifier will enhance the gain characteristics, but will decrease the speed of the device 50.

Input 60 to the doubly differential amplifier 50 of FIG. 3 may be, for example, an IR detector pixel which drives the control lines of devices 52 and 54 generating an amplified differential current 62 and 64 in the outer loop 68. This outer loop 68 forms the control lines for SFFTs 56 and 58. The output signal voltage is taken across the two resistive elements 72 and 74, of about $10\Omega$ each. The output equivalent circuit consists of a voltage source with an impedance of about $5\Omega$ and the input has very low impedance. The amplifier response time is limited to approximately 105 picoseconds by the L/R time constant in the outer loop 68. The actual circuit may encompass an area less than 30 μm by 30 μm which is smaller than a pixel of a typical currently available far-IR focal plane array. Thus, the doubly differential transimpedance amplifier of the invention may be mounted on the back of each pixel with no increase in area. With typical SFFTs and bias selected for maximum transresistance, power dissipation will generally not exceed 25 microwatts. Dynamic range with the invention has typically exceeded an equipment-limited 30 dB.

Figure 4A:
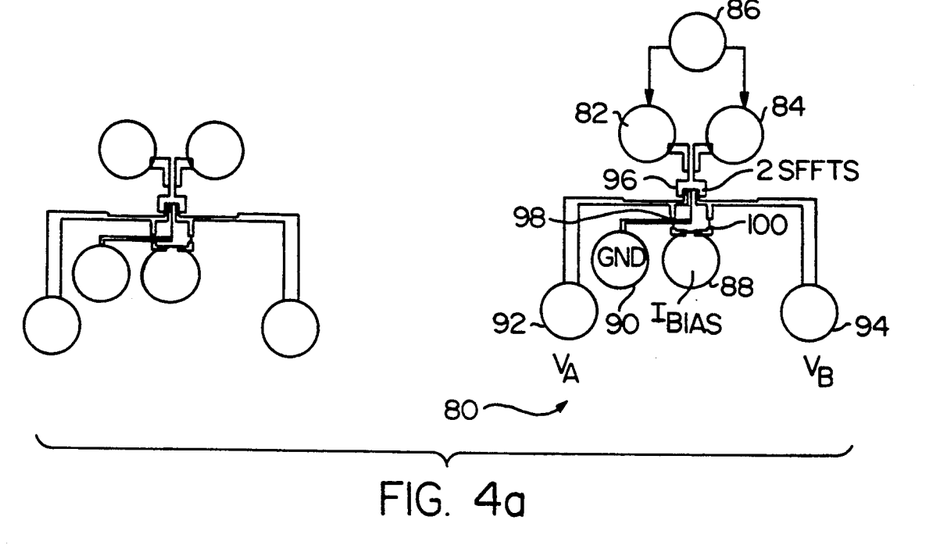
FIGS. 4a and 4b are physical layouts of the single differential pair and the double differential pair, respectively, of SFFTs configured into the transimpedance amplifier of the invention.
Figure 4B:
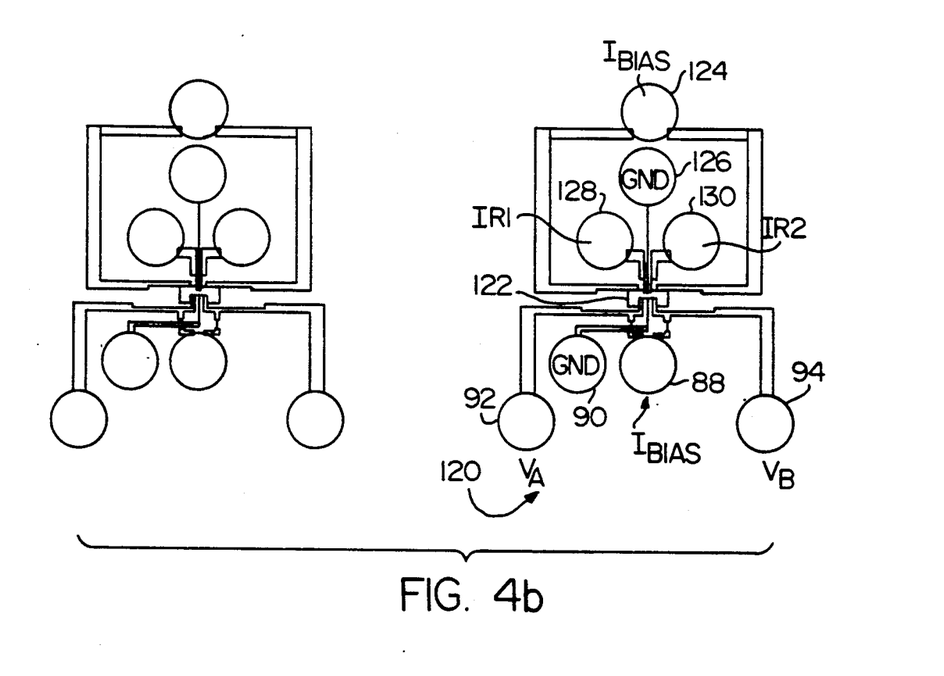

FIGS. 4a and 4b show the physical layout of the transimpedance differential amplifier; FIG. 4a is a single differential pair 80, schematically shown in FIG. 2, of the transimpedance amplifier. The weak current input 86 is connected to two upper pads 82 and 84. The bias is supplied in the middle lower pad 88, and pad 90 is connected to ground. The output voltage is taken across the two lower pads 92 and 94. All the components, including the SFFTs and the wiring, etc. is shown in the inner region 96 of the FIG. 4a; resistive elements 98 and 100 may also be implemented.

FIG. 4b illustrates the physical layout of the double differential transimpedance amplifier 120, shown as 50 in FIG. 3. The double differential transimpedance amplifier has two differential pairs of SFFTs in the inner region 122. The pad configuration is the same as in FIG. 4a with the exception of an added bias 124 and ground pad 126, which perform the same function as the other bias pad 88 and ground pad 90. A weak current source shown as a far-IR focal plane detector is located between pads 128 and 130. The output is taken across pads 92 and 94.

Far-infrared focal plane arrays are becoming increasingly important for terrestrial and space-based imaging applications. For noise reasons, it is desirable to have transresistance pre-amplifiers at the focal plane and therefore they need to operate over wide temperature ranges. The invention described herein, then, provides high temperature superconducting amplifiers characterized by high gain, relatively low noise, and response times less than 200 picoseconds over at least a 10–80K temperature range.

Figure 5A:
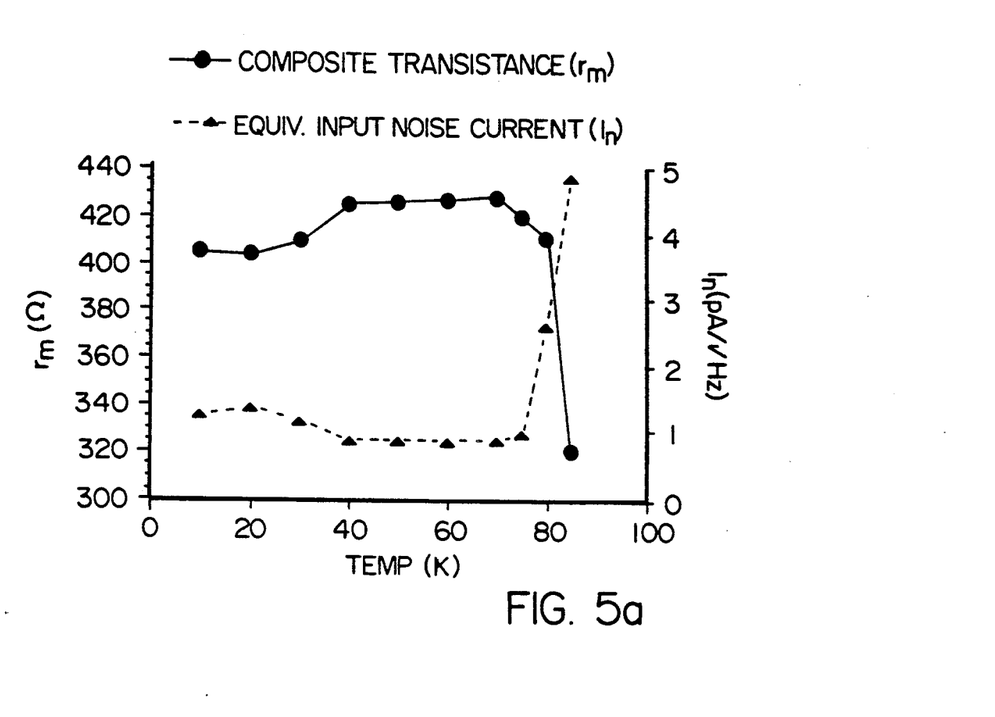
FIGS. 5a and 5b is a plot of the composite transresistance and the input noise current of the transimpedance amplifier using a YBaCuO device, and the schematic of the circuit used to obtain the measurement.
Figure 5B:
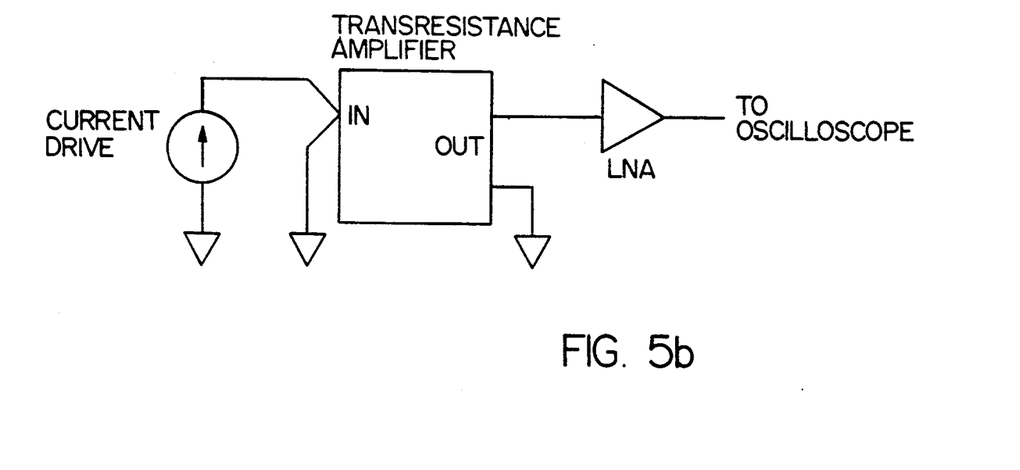

For this application with far-infrared focal plane arrays of the transimpedance amplifier, the critical amplifier performance needs are transresistance gain, temperature stability, and minimal noise. Composite transresistance, $r_m$, and effective input noise current, $I_n$, of the amplifier alone were measured as a function of temperature and the results are shown in FIG. 5a for a YBaCuO device using relatively highly pinned films. For both types of measurements, the input drive was a current source of impedance greater than 100KΩ driving the amplifier input whose impedance is less than $0.5\Omega$. The transresistance, a DC value that was essentially constant through at least 500 MHz, stays fairly constant near $400\Omega$ over the range 10–80K which was measured with a $50\Omega$ oscilloscope impedance. Typical transresistances for TlCaBaCuO and weakly-pinned YBaCuO amplifiers between 40K and 77K are $500\Omega$ and $490\Omega$ respectively. The equivalent input noise current, $I_n$, was measured using a follower low-noise amplifier and power spectral computations; the values at 10 Hz are plotted in FIG. 5a, along with an outline of the measurement arrangement shown in FIG. 5b. System noise was measured without the amplifier in place and was found to be about $1$ nV/(Hz)$^{\frac{1}{2}}$ at the output. This was subtracted from the measured total output noise with the amplifier in place before referring it to the input. Over this temperature range $I_n$ does not change much but there is considerable uncertainty of $\pm 0.5$ pA/(Hz)$^{\frac{1}{2}}$ in these noise values because of equipment limitations. Typical broadband, down to $\approx 100$ Hz, noise current of far-IR detectors are on the order of 1 pA/(Hz)$^{\frac{1}{2}}$ depending on pixel area so there may be some system noise concerns. Typical noise values for amplifiers made from TlCaBaCuO or weakly pinned YBaCuO are about 0.5 pA/(Hz)$^{\frac{1}{2}}$.

TlCaBaCuO devices have more variation in both $r_m$ and $I_n$ below about 40K; about 10% changes in composite transresistance, $r_{m\ composite}$, and about 20-25% changes in equivalent input noise current. This probably happens because of the flux lattice change discussed earlier. TlCaBaCuO amplifier performance is, however, stable up to about 95K.

Speed is not as much of a concern as the above parameters because the detectors are relatively slow. The rise times were measured using time domain transmission techniques on a high speed sampling oscilloscope, a 50Ω system. Over the range 10-80K, amplifier rise time has been less than a fixture-limited 180 picoseconds for all circuits tested. The amplifier rise time did not show up clearly in these measurements because of apparatus limitations, but in more careful single device measurements, devices made with highly pinned YBaCuO have been shown to be somewhat slower than those made of the other two material types.

Figure 6:
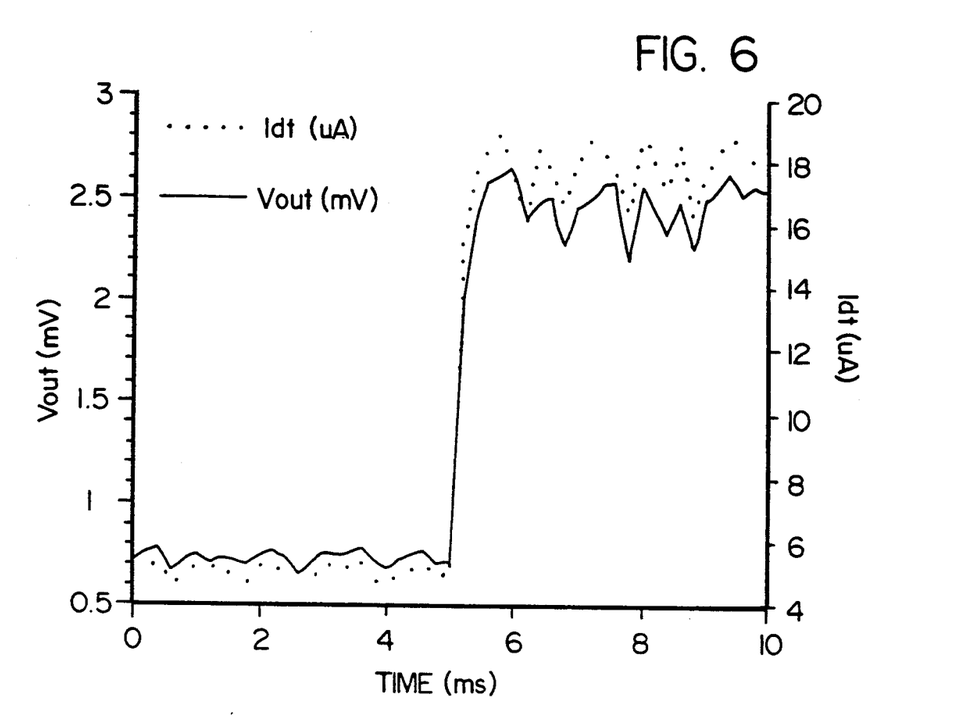
FIG. 6 illustrates a typical response of the superconducting transimpedance amplifier as a IR line driver.

A practical test was undertaken to couple the amplifier to an actual IR detector and measure the response to light changes. The IR detector used was grown using molecular beam epitaxy and consists of an InSb-based PIN photodiode embedded in an In $As_{0.17}Sb_{0.83}$/InSb of 15 nm/15 nm thick layers strained layer superlattice. The peak photoresponse for this detector occurred at a wavelength of about 5 μm with a detectivity of $10^{10}$ cm $Hz^{\frac{1}{2}}$/W. The photodiode spanned both mid and long wavelength infrared spectral regions with usable photoresponse extending out to 12 μm. A SiC IR source with a mechanical chopper in front was used as the excitation. A swing of over 2 mV was delivered to the 50Ω load, or any load greater than 10Ω, for that matter. The time response of the detector alone and the detector plus the amplifier are shown in FIG. 6. The amplifier was easily responsive to the detector and qualitatively did not add noise. This measurement was done at 77K and while the detector's response changed at lower temperatures, the amplifier remained very stable. Similar response curves with increase of up to 20-30% gain and output voltage levels were obtained with amplifiers made from TlCaBaCuO or weakly pinned YBaCuO.

Thus, this relatively simple, small area circuit provides adequate, broad temperature range transresistance gain for a far-IR detector allowing it to easily drive processing electronics. Bandwidth will be limited only by the detector and the noise added by the amplifier will be minimal compared to that of the detector. For YBaCuO devices, stable performance is available over at least 10-80K, while for TlCaBaCuO devices the range is 10-95K with up to 10% variation in $r_{m,\ composite}$.

Figure 7:
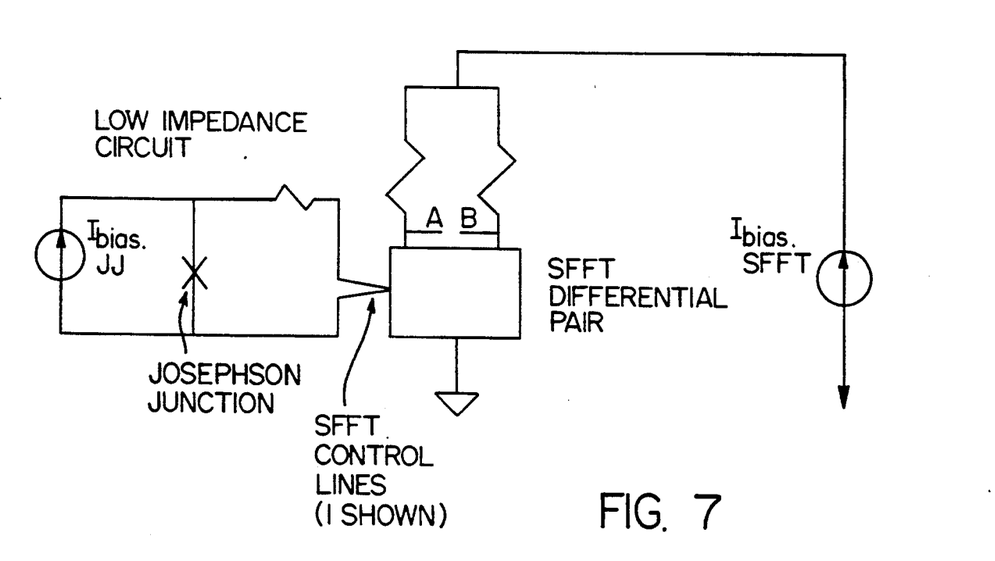
FIG. 7 is a schematic of a circuit using a Josephson junction as the weak current source that drives the transimpedance amplifier of the invention.
Figure 8:
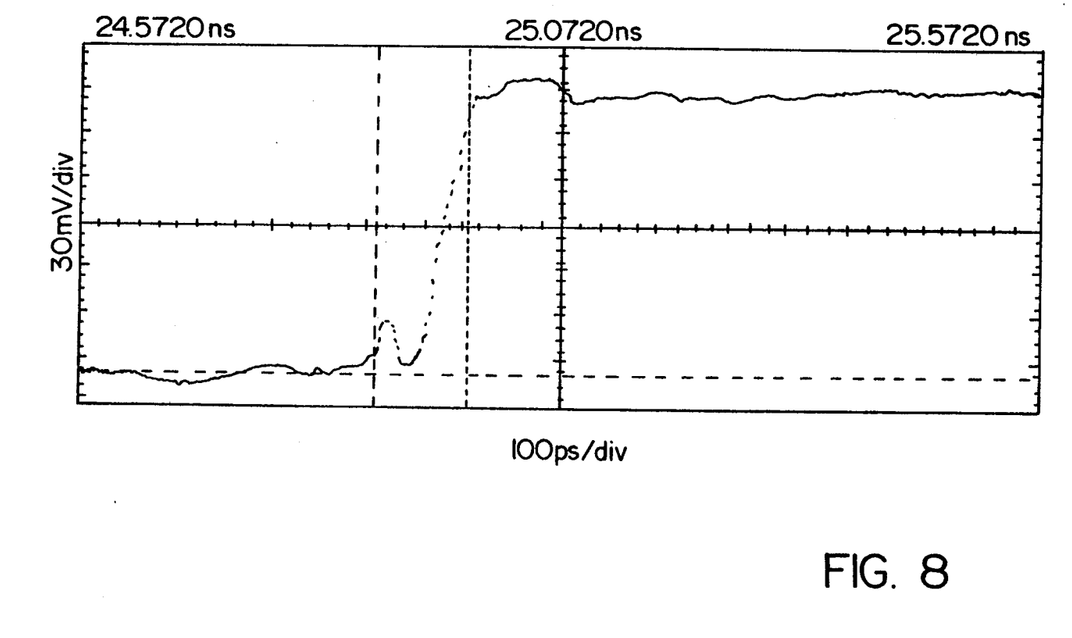
FIG. 8 is a graph of the transient response of a single differential pair SFFT transimpedance amplifier to a Josephson junction switching event.

Another application of the transimpedance amplifier of the invention is with Josephson junctions. Josephson junctions can typically drive a current on the order of milliamps into a low impedance. In contrast to the far-IR detectors, however, the junctions will most likely be used at high speed, hence the single differential pair shown in FIG. 2 may be more appropriate. In a typical circuit shown in FIG. 7, the junction will switch causing a current to be driven into the control lines of the amplifier. The output of the transimpedance amplifier of the invention is at a suitable signal and impedance level to drive conventional high speed electronics such as MESFETs or HEMTs. A transient response of the amplifier output to a junction switching event is shown in FIG. 8. In practice, moreover, entire junction-based circuits, rather than a single junction, may drive the amplifier. These circuits include Josephson logic, parametric amplifier, SIS mixers and waveform shapers. In all of these applications, the signals from the Josephson circuits are in the form of small currents and must be amplified and transferred to a higher impedance to communicate with conventional circuitry.

While the invention has been described with respect to several embodiments, and to several applications, it is intended that the invention not be limited to the specifics disclosed therein; rather, the invention is presented as broadly claimed.

What is claimed is:

1. A transimpedance amplifier comprising:
   (a) a first high temperature superconducting flux flow transistor having a control line;
   (b) a second high temperature superconducting flux flow transistor having a control line, said second transistor connected in parallel with said first transistor;
   (c) means to drive said control lines, said control line driving means to apply a signal of opposite polarity to said second transistor than a signal to said first transistor; and
   (d) means to provide a current bias to said transistors sufficient to drive said transistors into a flux flow state;
      wherein an output signal from said means to drive said control lines is converted to higher signal and higher impedance levels which is taken across said transistors.

2. The transimpedance amplifier of claim 1, further comprising:
   (e) a first impedance element with a resistive component connected between said first superconducting flux flow transistor and said means to provide a current bias to said first transistor; and
   (f) a second impedance element with a resistive component connected between said second superconducting flux flow transistor and said means to provide a current bias to said second transistor;
      wherein said first and second impedance elements increase said output signal and impedance.

3. The transimpedance amplifier of claim 1, wherein said means to drive said control lines is a weak current source.

4. The transimpedance amplifier of claim 3, wherein said weak current source is at least one Josephson junction.

5. The transimpedance amplifier of claim 3, wherein said weak current source is at least one far-infrared focal plane detector.

6. The transimpedance amplifier of claim 3, wherein said output is applied to electronics having higher signal and impedance.

7. A transimpedance amplifier comprising:
   (a) a first high temperature superconducting flux flow transistor having a first control line;
   (b) a second high temperature superconducting flux flow transistor having a second control line, said first and second superconducting flux flow transistor connected in parallel
   (c) a bias means to provide a bias current sufficient to drive said first and second superconducting flux flow transistor into a flux flow state; said bias current split between each of said superconducting flux flow transistors arranged as a differential amplifier;
   (d) a weak current input to said first and second superconducting flux flow transistors at said first and second control lines, respectively, wherein said input to said first superconducting flux flow transistor is of opposite polarity than the input to said second superconducting flux flow transistor;

wherein said input is amplified by said differential amplifier arrangement to be an output taken across each of said superconducting flux flow transistors.

8. A double differential transimpedance amplifier comprising:
(a) a bias means connected to each of a plurality of high temperature superconducting flux flow transistors to provide a bias current sufficient to drive each of said plurality of superconducting flux flow transistors into a flux flow state;
(b) a first high temperature superconducting flux flow transistor;
(c) a second high temperature superconducting flux flow transistor, said first and second superconducting flux flow transistor connected in parallel;
(d) an input applied to said first and second superconducting flux flow transistor, said input of low impedance and weak current, wherein said input as applied to said first superconducting flux flow transistor is of opposite polarity than that applied to said second superconducting flux flow transistor;
(e) an output of said first and second superconducting flux flow transistor wherein said output is an amplified signal of said input;
(f) a third high temperature superconducting flux flow transistor, and an ancillary impedance connected between said bias means and said third superconducting flux flow transistor, and a second input which is said output of said first and second superconducting flux flow transistor;
(g) a fourth high temperature superconducting flux flow transistor, and an ancillary impedance connected between said bias means and said fourth superconducting flux flow transistor, and a second input which is said output of said first and second superconducting flux flow transistor, wherein said input as applied to said fourth superconducting flux flow transistor is of opposite polarity than that applied to said third superconducting flux flow transistor, said third and fourth superconducting flux flow transistor connected in parallel,
(g) a second output which is an amplified signal of said second input, wherein said input is amplified by said double differential transimpedance amplifier to be said second output taken across said third and fourth superconducting flux flow transistors.

9. The transimpedance amplifier of claim 8, wherein said input is from at least one Josephson junction.

10. The transimpedance amplifier of claim 8, wherein said input is from at least one far-infrared focal plane detector.

11. The transimpedance amplifier of claim 8, wherein said second output is applied to electronics having higher signal and impedance.

12. A transimpedance amplifier stage, comprising:
(a) at least one differential amplifier comprised of two high temperature superconducting flux flow transistors connected in parallel wherein an input signal is applied to each of said superconducting flux flow transistors, said signal applied as opposite polarity to each of said superconducting flux flow transistors;
(b) means to supply a bias current to each of said superconducting flux flow transistors sufficient to drive each superconducting flux flow transistor into a flux flow state;

wherein said input signal is amplified by said differential amplifier to be an output signal of higher impedance.

13. A multiple-stage transimpedance amplifier, comprising:
(a) a first amplifier stage of claim 12, wherein said input signal is derived from a weak current source;
(b) at least one intermediate amplifier stage, comprising the amplifier stage of claim 12, wherein an intermediate input signal of said intermediate amplifier stage is an output of a previous amplifier stage, and an intermediate output signal of said intermediate amplifier stage is of higher impedance and magnitude than both of said input signals;
(c) a final amplifier stage, comprising the amplifier stage of claim 12, and further comprising an impedance element with a resistive component placed between said means to supply said bias current and said superconducting flux flow transistors of said final amplifier stage, wherein a final input to said final amplifier stage is an output signal of a previous amplifier stage, wherein an ultimate output signal of said multiple stage transimpedance amplifier is of higher impedance and magnitude than said input signals.

* * * * *

UNITED STATES PATENT AND TRADEMARK OFFICE
CERTIFICATE OF CORRECTION

PATENT NO. : 5,262,395
DATED : November 16, 1993
INVENTOR(S) : David S. Ginley, et al.

It is certified that error appears in the above-indentified patent and that said Letters Patent is hereby corrected as shown below:

On the title page, "13 Claims, 6 Drawing Sheets' should read --13 Claims, 7 Drawing Sheets--.

The drawing sheet consisting of figure 9, whould be added as shown on the attached page.

Signed and Sealed this

Twentieth Day of June, 1995

Attest:

BRUCE LEHMAN

Attesting Officer

Commissioner of Patents and Trademarks

United States Patent [19]
Ginley et al.

[11] Patent Number: 5,262,395
[45] Date of Patent: Nov. 16, 1993

[54] SUPERCONDUCTING ACTIVE IMPEDANCE CONVERTER

[75] Inventors: David S. Ginley, Albuquerque; Vincent M. Hietala, Placitas; Jon S. Martens, Albuquerque, all of N. Mex.

[73] Assignee: The United States of America as represented by the United States Department of Energy, Washington, D.C.

[21] Appl. No.: 850,475

[22] Filed: Mar. 12, 1992

[51] Int. Cl.$^5$ ............................................. H03F 3/00
[52] U.S. Cl. ............................ 505/855; 307/306; 330/61 R; 330/252
[58] Field of Search .................. 330/60, 61 R, 61 A, 330/62, 63, 252; 307/306, 245; 505/855

[56] References Cited
U.S. PATENT DOCUMENTS
3,356,960 12/1967 Edwards et al. ............... 330/61 R Primary Examiner—James B. Mullins
Attorney, Agent, or Firm—Karla Ojanen; James H. Chafin; William R. Moser

[57] ABSTRACT

A transimpedance amplifier for use with high temperature superconducting, other superconducting, and conventional semiconductor allows for appropriate signal amplification and impedance matching to processing electronics. The amplifier incorporates the superconducting flux flow transistor into a differential amplifier configuration which allows for operation over a wide temperature range, and is characterized by high gain, relatively low noise, and response times less than 200 picoseconds over at least a 10–80 K. temperature range. The invention is particularly useful when a signal derived from either far-IR focal plane detectors or from Josephson junctions is to be processed by higher signal/higher impedance electronics, such as conventional semiconductor technology.

13 Claims, 7 Drawing Sheets

Figure 9